(12) United States Patent
Fukuyama et al.

(10) Patent No.: US 8,735,905 B2
(45) Date of Patent: May 27, 2014

(54) METHOD FOR PRODUCING ALUMINUM NITRIDE CRYSTALS

(75) Inventors: Hiroyuki Fukuyama, Miyagi (JP); Masayoshi Adachi, Miyagi (JP); Akikazu Tanaka, Tokyo (JP); Kazuo Maeda, Tokyo (JP)

(73) Assignees: Sumitomo Metal Mining Co., Ltd., Tokyo (JP); Tohoku University, Sendai-shi, Miyagi (JP)

( * ) Notice: Subject to any disclaimer, the term of this patent is extended or adjusted under 35 U.S.C. 154(b) by 0 days.

(21) Appl. No.: 13/809,261

(22) PCT Filed: Jul. 14, 2011

(86) PCT No.: PCT/JP2011/066146
§ 371 (c)(1),
(2), (4) Date: Mar. 4, 2013

(87) PCT Pub. No.: WO2012/008545
PCT Pub. Date: Jan. 19, 2012

(65) Prior Publication Data
US 2013/0187170 A1 Jul. 25, 2013

(30) Foreign Application Priority Data

Jul. 14, 2010 (JP) ................................ 2010-159973
Jan. 25, 2011 (JP) ................................ 2011-012770
Mar. 8, 2011 (JP) ................................ 2011-050415

(51) Int. Cl.
*H01L 29/15* (2006.01)
*H01L 31/0256* (2006.01)

(52) U.S. Cl.
USPC ............ 257/76; 117/54; 117/73; 117/77; 117/78; 117/950; 117/952; 257/79; 257/771; 257/E21.09; 257/E21.097; 257/E21.065

(58) Field of Classification Search
CPC ........ B32B 9/04; C01B 21/072; C30B 29/38; C30B 19/02; C30B 1/00; C30B 35/00; C30B 9/10; C30B 29/403; C30B 11/00; C30B 23/00; C30B 28/12; C30B 25/02; C30B 25/10; C30B 25/18; H01L 21/00; H01L 21/06; H01L 21/20; H01L 21/84; H01L 21/205; H01L 21/208; H01L 21/302; H01L 21/461; H01L 33/00
USPC ........... 117/36, 41, 53, 54, 56, 58, 63, 64, 65, 117/67, 73, 74, 77, 78, 88, 109, 934, 950, 117/952, 953; 257/22, 76, 79, 103, 190, 257/771, E33.005, E21.09, E21.097, 257/E21.108, E21.117, E21.122, E21.132, 257/E21.461, E21.465; 423/412; 428/698; 438/22
See application file for complete search history.

(56) References Cited

U.S. PATENT DOCUMENTS

| | | | |
|---|---|---|---|
| 2005/0059257 A1* | 3/2005 | Fukuyama et al. | ............ 438/725 |
| 2006/0175619 A1 | 8/2006 | Fukuyama et al. | |
| 2007/0144427 A1* | 6/2007 | Iwai et al. | ............ 117/77 |
| 2010/0215987 A1 | 8/2010 | Fukuyama et al. | |
| 2011/0018104 A1* | 1/2011 | Nagashima et al. | ............ 257/615 |

FOREIGN PATENT DOCUMENTS

| | | |
|---|---|---|
| JP | A-11-189498 | 7/1999 |
| JP | A-2004-224600 | 8/2004 |
| JP | A-2005-104829 | 4/2005 |
| JP | A-2006-213586 | 8/2006 |
| JP | A-2006-306638 | 11/2006 |
| JP | A-2007-39292 | 2/2007 |
| JP | A-2008-266067 | 11/2008 |
| WO | WO 2006/030718 A1 | 3/2006 |

OTHER PUBLICATIONS

Hiroyuki Fukuyama, Shin-ya Kusunoki, Akira Hakomori, and Kenji Hiraga, Single crystalline aluminum nitride films fabricated by nitriding—Al2O3, Journal of Applied Physics, 100, 024905 (2006).*
Aug. 30, 2011 International Search Report issued in International Application No. PCT/JP2011/066146 (with translation).

* cited by examiner

Primary Examiner — Fei Fei Yeung Lopez
Assistant Examiner — Stanley S Zuo
(74) Attorney, Agent, or Firm — Oliff PLC

(57) ABSTRACT

Provided is a method for producing inexpensive and high-quality aluminum nitride crystals. Gas containing N atoms is introduced into a melt of a Ga—Al alloy, whereby aluminum nitride crystals are made to epitaxially grow on a seed crystal substrate in the melt of the Ga—Al alloy. A growth temperature of aluminum nitride crystals is set at not less than 1000 degrees C. and not more than 1500 degrees C., thereby allowing GaN to be decomposed into Ga metal and nitrogen gas.

8 Claims, 8 Drawing Sheets

Surface direction

Surface direction

METHOD FOR PRODUCING ALUMINUM NITRIDE CRYSTALS

FIELD OF THE INVENTION

The present invention relates to a method for producing aluminum nitride crystals, the method epitaxially growing AlN by a liquid phase epitaxy (LPE) method. The present application asserts priority rights based on JP Patent Application 2010-159973 filed in Japan on Jul. 14, 2010, JP Patent Application 2011-012770 filed in Japan on Jan. 25, 2011, and JP Patent Application 2011-050415 filed in Japan on Mar. 8, 2011. The total contents of disclosure of the Patent Application of the senior filing date are to be incorporated by reference into the present application.

BACKGROUND OF THE INVENTION

Ultraviolet light emitting diodes have widely attracted attention as a next-generation light source to be used for a substitute for fluorescent lamps, a high-density DVD, a laser for biochemistry, decomposition of harmful substances by a photocatalyst, a He—Cd laser, a substitute for mercury-vapor lamps, and the like. Ultraviolet light emitting diodes are composed of an AlGaN nitride semiconductor called a wide gap semiconductor, and laminated on different kinds of substrates, such as sapphire, 4H—SiC, and GaN, shown in Table 1.

However, there is a large lattice mismatch between sapphire and AlGaN, whereby a lot of threading dislocations are present and become the center of non-radiative recombination to remarkably reduce internal quantum efficiency. 4H—SiC and GaN have high lattice matching with AlGaN, but are expensive. In addition, 4H—SiC and GaN absorb ultraviolet rays having a wavelength of not more than 380 nm, and a wavelength of not more than 365 nm, respectively.

Meanwhile, AlN has a lattice constant similar to that of AlGaN and is transparent in an up to 200-nm ultraviolet region, whereby, without absorbing ultraviolet rays emitting light, ultraviolet light can be efficiently taken out to the exterior. In other words, using AlN single crystals as a substrate, an AlGaN light-emitting diode is made to quasihomoepitaxially grow, whereby an ultraviolet light emitting diode which is controlled to have a lower crystal defective density can be produced.

TABLE 1

| Ultraviolet LED Substrate | Sapphire | SiC | GaN | AlN |
|---|---|---|---|---|
| Cost | o | x | x | x |
| Lattice Matching | x | o | o | o |
| Ultraviolet Light Transmittance | o | Δ | Δ | o |

Currently, using methods, such as an HVPE method (hydride vapor phase epitaxy method), a liquid phase epitaxy method, and a sublimation-recondensation method, trial production of bulk single crystals of AlN has been conducted. For example, PTL 1 discloses that, in a liquid phase epitaxy method of group III nitride crystals, a pressure is applied in order to increase an amount of nitrogen dissolved in a flux, whereby alkali metals, such as sodium, are added to the flux. PTL 2 proposed a method for producing AlN microcrystals by introducing gas containing nitrogen atoms into a melt of Al.

However, when AlN crystals are produced using the technique of PTL 1 or PTL 2, a high growth temperature is needed, and accordingly production costs and crystal quality of AlN crystals are not satisfactory.

PRIOR-ART DOCUMENTS

Patent Document

PTL 1: Japanese Patent Application Laid-Open No. 2004-224600

PTL 2: Japanese Patent Application Laid-Open No. Hei 11-189498

SUMMARY OF THE INVENTION

The present invention is proposed in view of such actual circumstances, and provides a method for producing inexpensive and high-quality aluminum nitride crystals.

The present inventors earnestly studied, and consequently found that the use of a melt of a Ga—Al alloy as a flux in a liquid phase epitaxy method enabled the crystal growth of AlN at a low temperature and enabled the achievement of good AlN crystals which inherited the crystallinity of a substrate surface and had Al polarity.

In other words, a method for producing aluminum nitride crystals according to the present invention features that gas containing N atoms is introduced into a melt of a Ga—Al alloy, whereby aluminum nitride crystals are made to epitaxially grow on a seed crystal substrate in the melt of the Ga—Al alloy.

Furthermore, a crystal substrate according to the present invention is obtained in such a manner that aluminum nitride crystals having aluminum polarity are made to epitaxially grow on an aluminum nitride film having nitrogen polarity and being formed on a nitrided sapphire substrate.

EFFECTS OF INVENTION

According to the present invention, AlN crystals having a good quality can be made to grow at a low temperature, whereby production costs can be reduced. Moreover, according to the present invention, AlN crystals having aluminum polarity can be made to epitaxially grow on a nitrided sapphire substrate having nitrogen polarity. Therefore, by using growth conditions of a MOCVD (Metal Organic Chemical Vapor Deposition) method which is optimized for currently-used substrates having aluminum polarity, a multiple quantum well structure which is necessary for LED (Light Emitting Diode) and LD (Laser diode) devices can be produced.

BRIEF DESCRIPTION OF DRAWINGS

FIG. 7A is a bright field TEM photograph showing a cross-section of a sapphire nitride layer and a LPE layer under a two-beam condition using a diffraction line of a reciprocal lattice vector, g=[0002]. FIG. 7B is a bright field TEM photograph showing a cross-section of a sapphire nitride layer and a LPE layer under a two-beam condition using a diffraction line of a reciprocal lattice vector, g=[10-10]. FIG. 7C is a bright field TEM photograph showing a cross-section of a sapphire nitride layer and a LPE layer under a two-beam condition using a diffraction line of a reciprocal lattice vector, g=[10-12].

DETAILED DESCRIPTION OF THE INVENTION

Hereinafter, an embodiment of the present invention will be described in detail in the following order, with reference to the drawings.
1. Summary of the present invention
2. Method for producing aluminum nitride crystals
3. Examples

1. Summary of the Present Invention

The inventors have reported the results of differential thermo-gravimetry of GaN under a nitrogen atmosphere (Master's Thesis 2002 by Keiichi Shimizu, Department of Chemistry and Materials Science Graduate School of Science and Engineering, Tokyo Institute of Technology).

Figure 1:
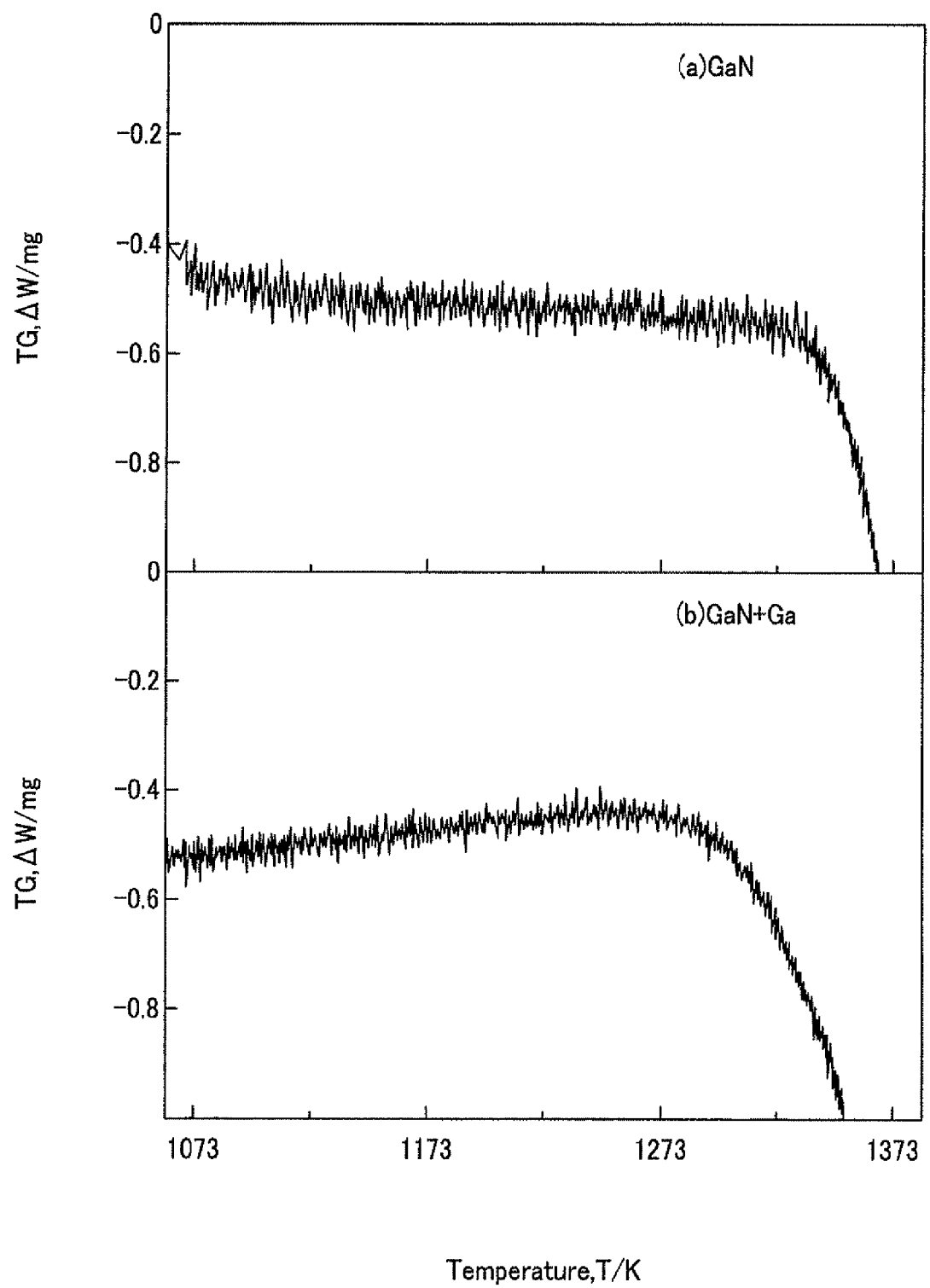
FIG. 1 is a graph showing a temperature dependence of weight change of each of GaN and GaN+Ga in a nitrogen atmosphere.

FIG. 1 is a graph showing a temperature dependence of weight change of each of GaN and GaN+Ga in a nitrogen atmosphere. Differential thermo-gravimetry was performed under an $N_2$ (manufactured by Taiyo Toyo Sanso Co., Ltd., a purity of 99.99995 vol %) atmosphere. Using GaN powder (manufactured by Showa Chemical Industry Co., Ltd., a purity of 99 mass %) and GaN+Ga (manufactured by The Nilaco Corporation, a purity of 99.9999 mass %) as samples, measurements were made from a temperature of 1075 K at a temperature rise rate of 5 K/min.

The measurement results in FIG. 1 shows that rapid weight loss of GaN occurs at a temperature of approximately 1300 K. This weight loss means that the GaN sample was decomposed into a Ga metal and nitrogen gas, and, in a case (b) using the Ga+GaN sample, rapid decomposition reaction occurs at a temperature lower by approximately 50 K than in a case (a) using the GaN sample.

Figure 2:
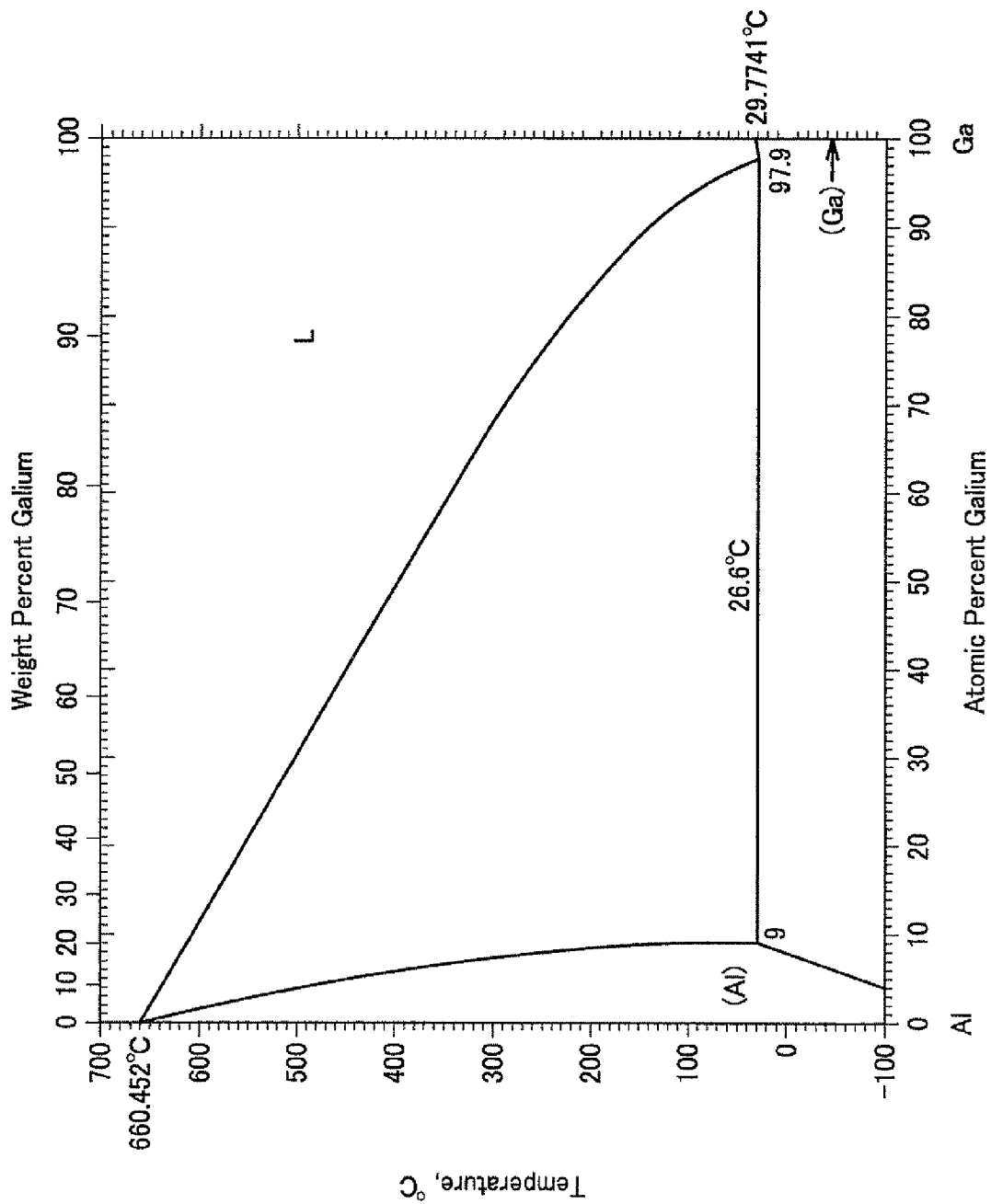
FIG. 2 is a phase diagram of a Ga—Al binary alloy.

FIG. 2 is a phase diagram of a Ga—Al binary alloy (See p31 of Desk Handbook: H. Okamoto, Phase Diagrams for Binary Alloys, Asm International (2000)). As shown in FIG. 2, when a flux of a mixture of Ga and Al is used, a liquidus temperature of the flux is not more than the Al melting point (660 degrees C.).

Based on such knowledge, the inventors found that the use of a melt of a Ga—Al alloy as a flux in a liquid phase epitaxy method enabled the crystal growth of AlN at a low temperature and enabled the achievement of good AlN crystals which inherited the crystallinity of a substrate surface.

In other words, a method for producing aluminum nitride crystals shown as an example of the present embodiment is such that gas containing N atoms is introduced into a melt of a Ga—Al alloy, whereby aluminum nitride crystals are made to epitaxially grow on a seed crystal substrate in the melt of the Ga—Al alloy. Thus, the crystal growth of AlN at a low temperature can be realized, and an expensive furnace equipped with special heat-resistant equipment becomes unnecessary, whereby production costs can be reduced. Also, good AlN crystals which inherit good crystallinity of a substrate surface and have aluminum polarity on the substrate having nitrogen polarity can be made to grow.

2. Method for Producing Aluminum Nitride Crystals

Next, a method for producing aluminum nitride crystals according to the present embodiment will be explained.

Figure 3:
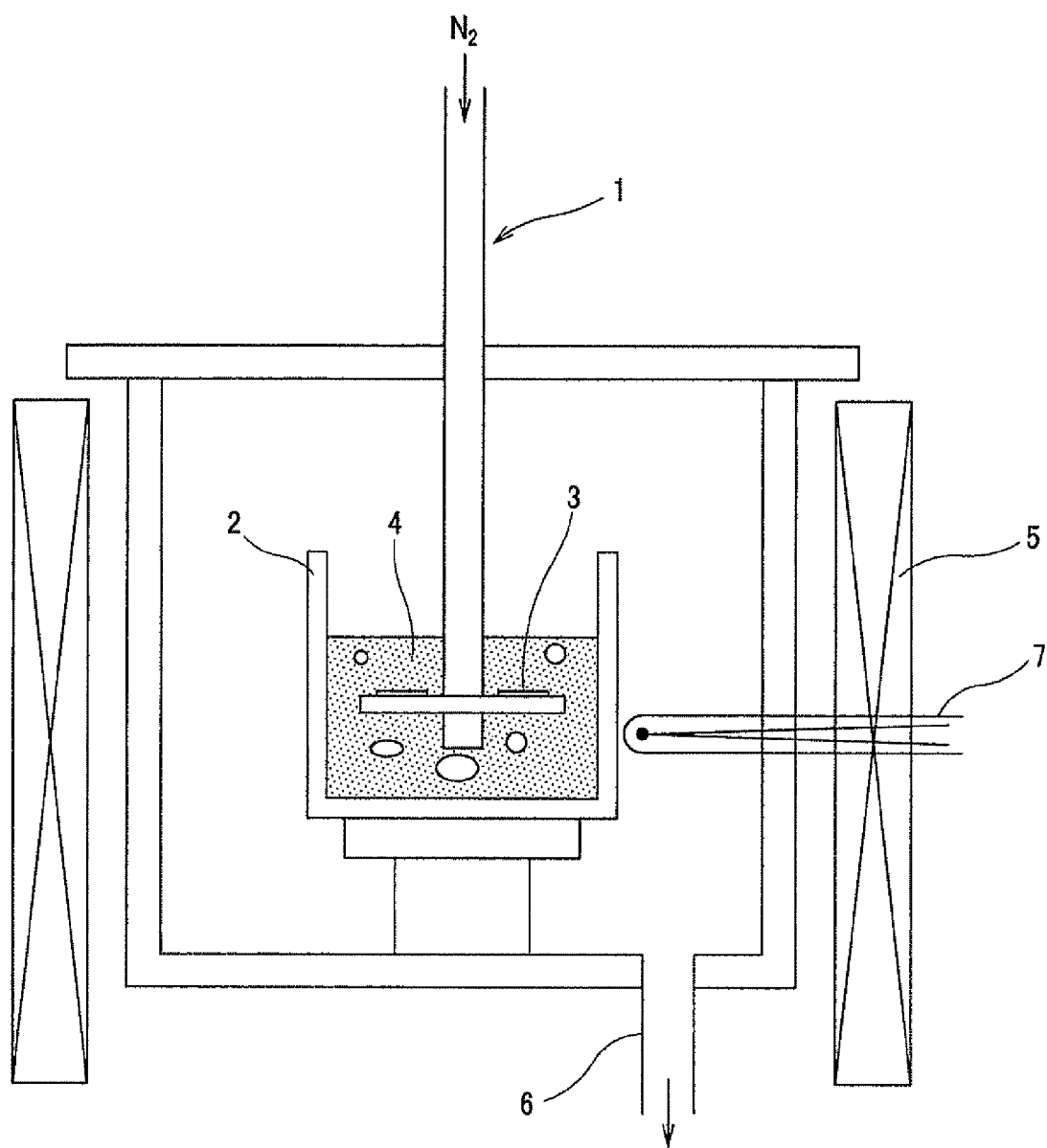
FIG. 3 shows a configuration example of an apparatus for producing AlN crystals.

FIG. 3 shows a configuration example of an apparatus for producing AlN crystals. This apparatus for producing AlN crystals includes a gas introducing pipe 1, a crucible 2, a heater 5 to heat a seed substrate 3 and a melt of a Ga—Al alloy 4 in the crucible 2, a gas exhausting pipe 6, and a thermocouple 7.

The gas introducing pipe 1 is movable up and down, whereby an end portion thereof can be inserted into the melt of the Ga—Al alloy 4 in the crucible 2. In other words, the melt of the Ga—Al alloy 4 can be bubbled with gas containing nitrogen. For the crucible 2, high-temperature-proof material, for example, ceramics, such as alumina and zirconia, may be used.

The seed substrate 3 is a lattice-matched substrate having a small lattice mismatch with AlN crystals, and, for example, a nitrided sapphire substrate, a SiC substrate, or a GaN substrate, each having an AlN thin film formed thereon, may be used. Among these, by using the nitrided sapphire substrate, AlN which inherits good crystallinity of a surface of the substrate can be made to homoepitaxially grow. The nitrided sapphire substrate can be obtained, for example, by methods disclosed in Japanese Patent Application Laid-Open No. 2005-104829, Japanese Patent Application Laid-Open No. 2006-213586, and Japanese Patent Application Laid-Open No. 2007-39292. Specifically, for example, a c-plane sapphire substrate is held for 1 hour at a nitrogen partial pressure of 0.9 atm and a CO partial pressure of 0.1 atm, and then held for 5 hours at a nitrogen partial pressure of 1.0 atm, whereby a nitrided sapphire substrate which is excellent in crystallinity of an AlN thin film can be obtained. The AlN film formed on the surface of this nitrided sapphire substrate is a c-axis oriented single crystal film and has nitrogen polarity which is terminated with nitrogen.

In the case of using a nitrided sapphire substrate for the seed substrate 3, the nitrided sapphire substrate is preferably annealed in, advance at a temperature of not less than 900 degrees C. and not more than 1500 degrees C. Even if a rotational domain is present in the AlN thin film, the annealing treatment promotes rearrangement of the domain to make the domain a c-axis oriented single domain.

The melt of the Ga—Al alloy 4 may have a molar ratio of Ga to Al of from 99:1 to 1:99. In particular, from viewpoints of low-temperature growth and crystallinity, a molar ratio of Ga to Al is preferably in a range of from 98:2 to 40:60, more preferably in a range of from 98:2 to 50:50.

As the gas containing nitrogen, $N_2$, $NH_3$, or the like may be used, but, from a viewpoint of safety, $N_2$ is preferably used. A nitrogen partial pressure of the gas containing nitrogen is usually not less than 0.01 MPa and not more than 1 MPa.

Next, a method for producing AlN crystals will be explained. First, a temperature starts to be raised in an atmosphere in which Ga and Al do not form a compound (for example, argon gas), and, after the temperature reaches the melting point of Al, gas containing nitrogen is introduced into the melt of the Ga—Al alloy 4. Then, the temperature of the melt of the Ga—Al alloy 4 in the crucible 2 is maintained at not less than 1000 degrees C. and not more than 1500 degrees C., and the seed substrate 3 is immersed in the melt of the Ga—Al alloy 4, whereby AlN crystals are formed on the seed substrate 3.

In the case of using a nitrided sapphire substrate for the seed substrate 3, the nitrided sapphire substrate is held just above the melt of the Ga—Al alloy 4 just before being immersed in the melt of the Ga—Al alloy 4, whereby the nitrided sapphire substrate can be annealed inside the apparatus for producing AlN crystals. A temperature of the substrate at the time of the annealing treatment is equivalent to the temperature of the melt 4 since the substrate is held right above the melt 4.

Here, when the temperature of the melt of the Ga—Al alloy 4 is made not less than 1000 degrees C., among GaN microcrystals and AlN microcrystals which are formed by combining gallium and aluminum in the melt with introduced nitrogen, respectively, only the GaN microcrystals are dissociated and decomposed into gallium and nitrogen. Accordingly, growth of the AlN crystals is not inhibited. Note that AlN crystals have a melting point of not less than 2000 degrees C., thereby being stable at not more than 1500 degrees C.

AlN crystals can be made to grow at 1 atmospheric pressure, and accordingly may be pressurized in the case where the solubility of nitrogen is small.

After a predetermined time passes, the seed substrate 3 is taken out from the melt of the Ga—Al alloy 4 to be cooled slowly. Or, until a temperature reaches a melting point of a simple substance of aluminum, that is, 660 degrees C., the seed substrate 3 is cooled slowly while being immersed in the melt of the Ga—Al alloy 4, whereby, also during the slow cooling, AlN crystals may be formed.

As explained above, by using gallium and aluminum, each having a low melting point and a high boiling point, as a flux in a liquid phase epitaxy method, and by introducing nitrogen gas into the flux, liquid phase growth of AlN crystals can be performed at a temperature much lower than the melting point of aluminum nitride.

According to the method for producing AlN crystals, equipment for purification of the gas, treatment of exhaust gas, and the like becomes unnecessary, and also, pressurized reaction vessels become unnecessary, and thus the structure of the apparatus becomes simpler, whereby costs can be reduced. Gallium is known as an element to be recycled easily, and recycling a flux thereof contributes also to energy saving and environmental protection.

Furthermore, the method for producing AlN crystals need not use the expensive organic metal gas used for a MOVPE (Metal Organic Vapor Phase Epitaxy) method and chlorine gas or hydrogen chloride gas used for a HYPE (Halide Vapor Phase Epitaxy) method, as a material, and therefore is safe.

EXAMPLES

3. Examples

Hereinafter, the present invention will be explained using Examples, but the present invention is not limited to these Examples.

Example 1

First, a c-plane sapphire substrate was held for 1 hour at a nitrogen partial pressure of 0.9 atm and a CO partial pressure of 0.1 atm, and then held for 5 hours at a nitrogen partial pressure of 1.0 atm, whereby a nitrified sapphire substrate was obtained. As for c-axis oriented AlN crystals, crystallinity of a tilt component (disorder of a crystal plane in a direction perpendicular to the crystal sample plane) is expressed as a full-width at half-maximum of an X-ray diffraction rocking curve of an AlN crystal (002) plane, while crystallinity of a twist component (disorder in a rotational direction in a crystal sample plane) is expressed as a full-width at half-maximum of a rocking curve of an AlN crystal (102) plane. The full-width at half-maximum of the tilt of the AlN crystal (002) plane was 83 arcsec, while the full-width at half-maximum of the twist of the AlN crystal (102) plane was 407 arcsec.

Next, a temperature of a flux composed of a melt of a Ga—Al alloy having a molar ratio of gallium to aluminum of 70:30 was raised in argon gas. After the temperature reaches the melting point of Al, 0.1 MPa of nitrogen gas was introduced into the flux at a flow rate of 20 cc/min. Then, the temperature of the flux in a crucible was maintained at 1300 degrees C., and the aluminum nitride substrate was immersed in the flux under atmospheric pressure. After 29 hours passed, the aluminum nitride substrate was cooled slowly while being immersed in the flux, whereby aluminum nitride crystals were produced.

Figure 4:
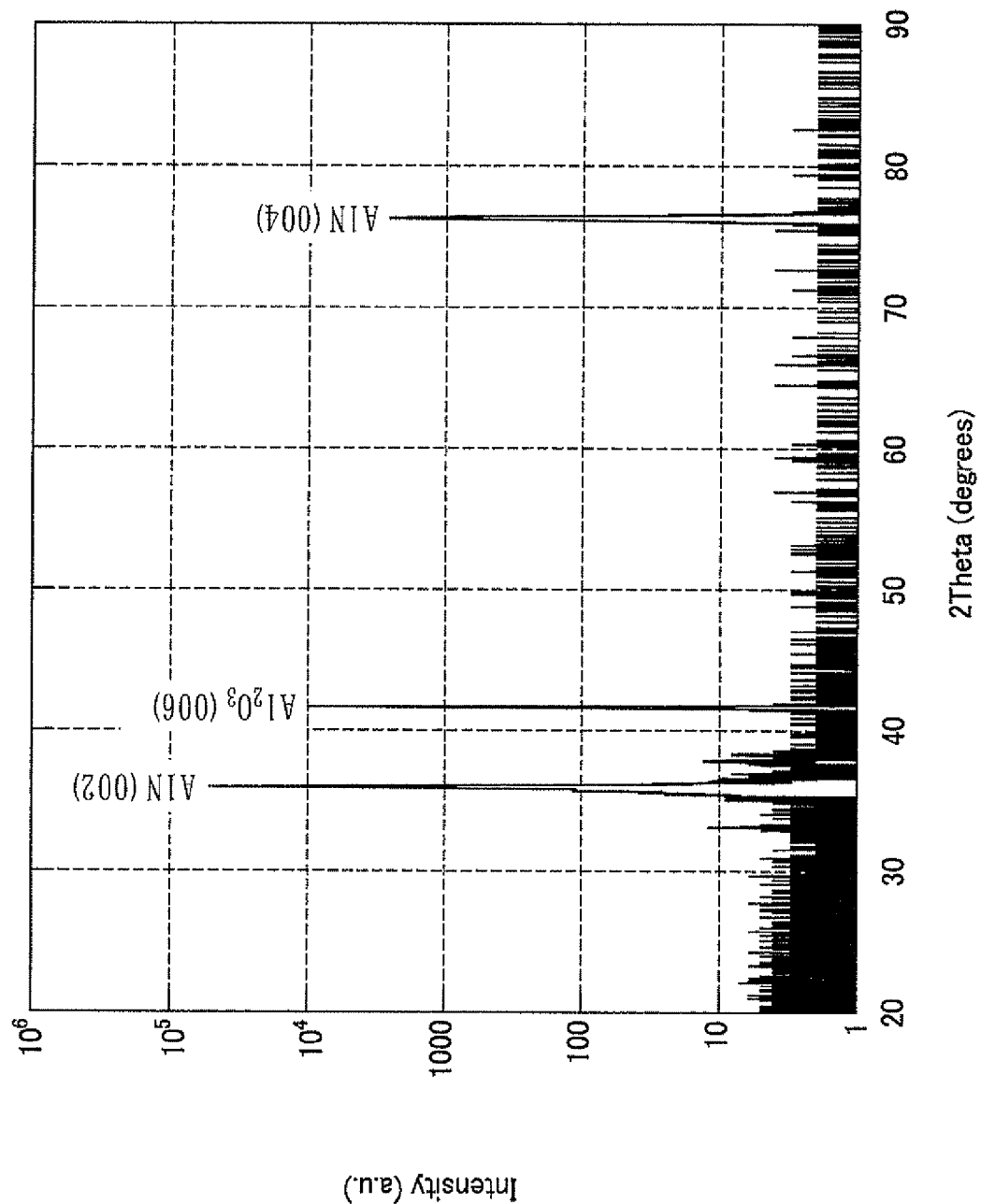
FIG. 4 is a graph showing measurement results of X-ray diffraction.

FIG. 4 is a graph showing measurement results of X-ray diffraction. Although c-plane peaks of the AlN (002) plane and the sapphire (006) plane were observed, peaks attributable to GaN and Ga metal were not observed. A full-width at half-maximum of the tilt of the AlN crystal (002) plane was 288 arcsec, while a full-width at half-maximum of the twist of the AlN crystal (102) plane was 670 arcsec.

Figure 5:
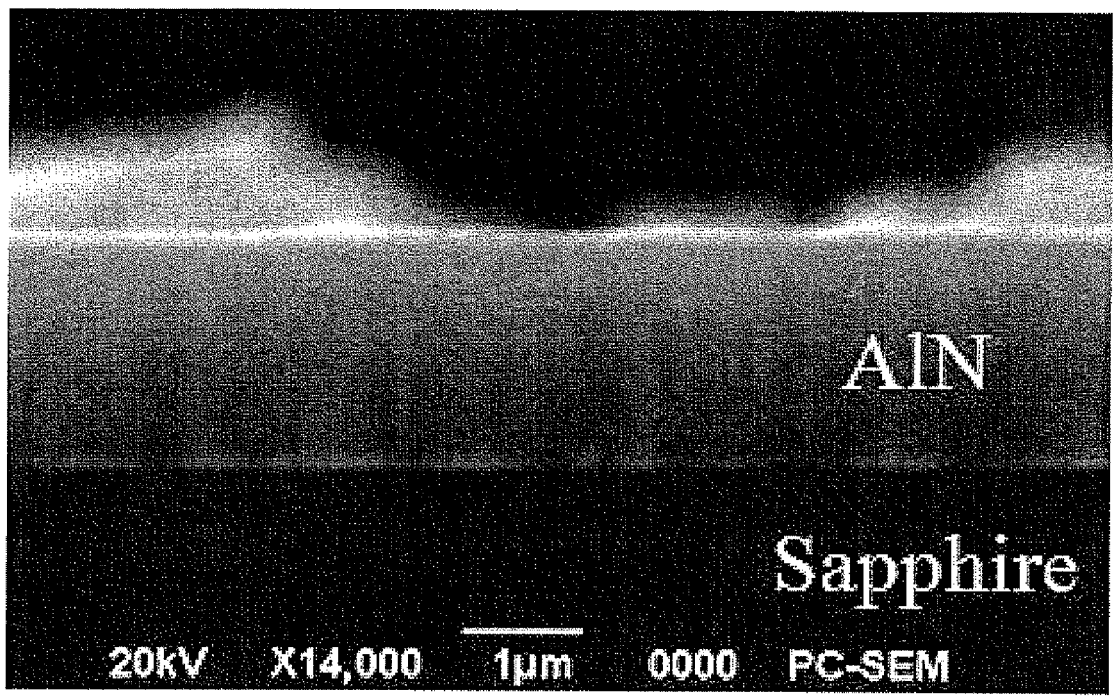
FIG. 5 is a SEM photograph showing a cross-section of a seed substrate after epitaxial growth.

FIG. 5 is a SEM photograph showing a cross-section of a seed substrate after epitaxial growth. The film thickness of AlN crystals was 2 μm, and good AlN crystals which inherited the quality of a nitride film on a nitrided sapphire substrate and had a high orientation were successfully made to epitaxially grow not less than 1 μm.

Figures 6A, 6B:
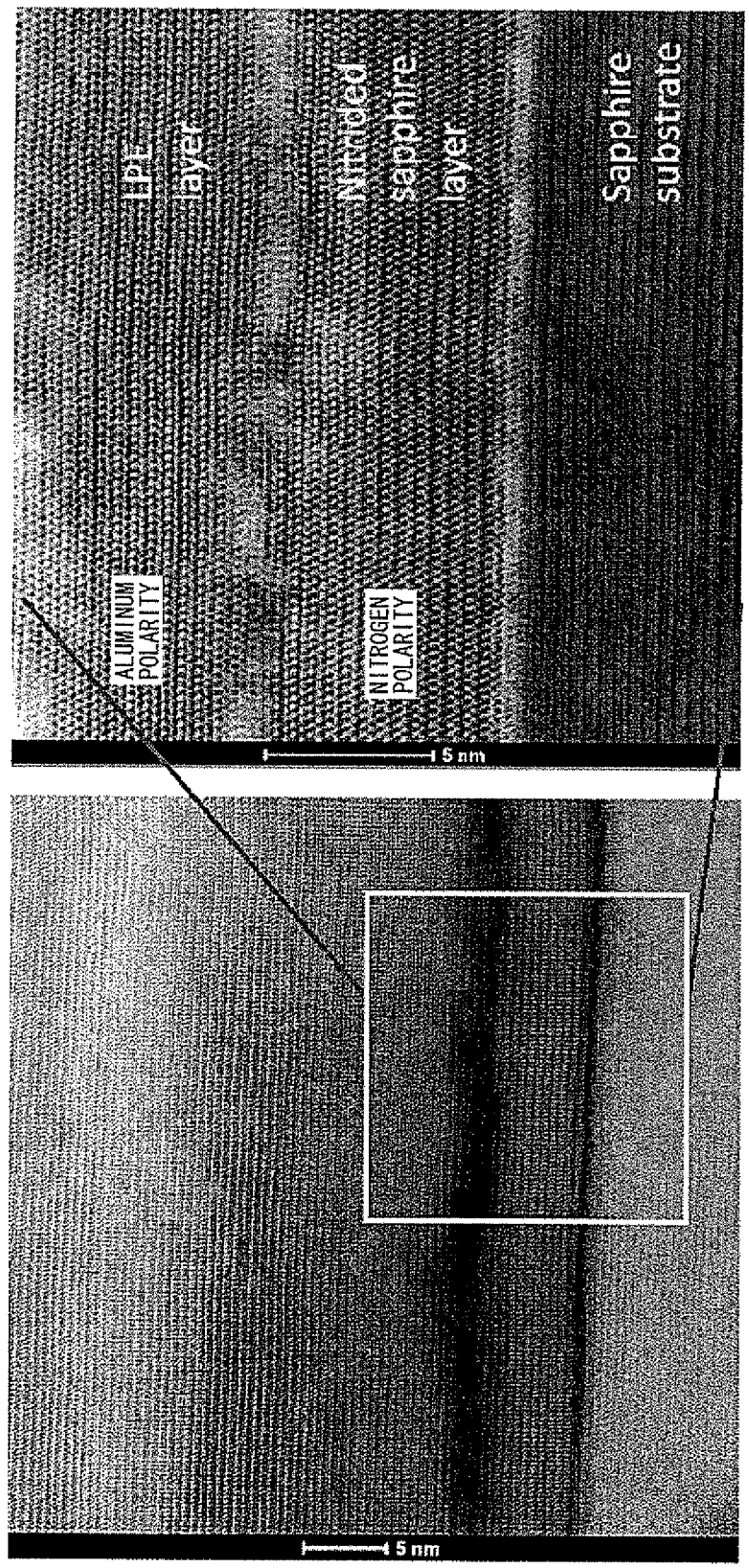
FIG. 6A is a TEM photograph showing a cross-section of a sapphire nitride layer and a LPE layer.
FIG. 6B is a TEM photograph showing an enlarged view of an interface between the sapphire nitride layer and the LPE layer.

FIG. 6A is a photograph obtained by observing a cross-section of a nitrided sapphire substrate and epitaxially-grown AlN crystals, using a transmission electron microscope (TEM). FIG. 6B is a TEM photograph showing an enlarged view of an interface between a sapphire nitride layer and a LPE layer. An AlN film formed by nitriding the substrate was observed on the nitrided sapphire substrate, and furthermore, on the AlN film, an epitaxially-grown AlN film was observed.

The polarities of the above-mentioned AlN films were evaluated using a CBED (Convergent-beam electron diffraction) method, and a result, it was confirmed that the AlN film formed by nitriding the sapphire substrate had nitrogen polarity, while the epitaxially-grown AlN film thereon had aluminum polarity. In other words, it was found that polarity was reversed at the interface between the AlN film on the nitrided sapphire substrate and the epitaxially-grown AlN film.

Example 2

Aluminum nitride crystals were produced in the same manner as in Example 1, except that, by using a nitrided sapphire substrate in which a full-width at half-maximum of the tilt of the AlN crystal (002) plane was 36 arcsec while a full-width at half-maximum of the twist of the AlN crystal (102) plane was 461 arcsec, the aluminum nitride substrate was immersed in the flux under atmospheric pressure for 5 hours. As a result, the full-width at half-maximum of the tilt of the AlN crystal (002) plane was 79 arcsec while the full-width at half-maximum of the twist of the AlN crystal (102) plane was 576 arcsec. Also, the film thickness of the AlN crystals was 0.7 µm. Also, the epitaxially grown AlN film was evaluated to have aluminum polarity.

Example 3

Aluminum nitride crystals were produced in the same manner as in Example 1, except that, by using a nitrided sapphire substrate in which a full-width at half-maximum of the tilt of the AlN crystal (002) plane was 36 arcsec while a full-width at half-maximum of the twist of the AlN crystal (102) plane was 461 arcsec, the aluminum nitride substrate was immersed in a flux having a molar ratio of gallium to aluminum of 60:40 under atmospheric pressure for 5 hours. As a result, the full-width at half-maximum of the tilt of the AlN crystal (002) plane was 50 arcsec while the full-width at half-maximum of the twist of the AlN crystal (102) plane was 544 arcsec. Also, the film thickness of the AlN crystals was 1.0 µm. Also, the epitaxially grown AlN film was evaluated to have aluminum polarity.

Example 4

Aluminum nitride crystals were produced in the same manner as in Example 1, except that, by using a nitrided sapphire substrate in which a full-width at half-maximum of the tilt of the AlN crystal (002) plane was 54 arcsec while a full-width at half-maximum of the twist of the AlN crystal (102) plane was 439 arcsec, the aluminum nitride substrate was immersed in a flux having a molar ratio of gallium to aluminum of 50:50 under atmospheric pressure for 5 hours. As a result, the full-width at half-maximum of the tilt of the AlN crystal (002) plane was 68 arcsec while the full-width at half-maximum of the twist of the AlN crystal (102) plane was 698 arcsec. Also, the film thickness of the AlN crystals was 0.3 Also, the epitaxially grown AlN film was evaluated to have aluminum polarity.

Example 5

Aluminum nitride crystals were produced in the same manner as in Example 1, except that, by using a nitrided sapphire substrate in which a full-width at half-maximum of the tilt of the AlN crystal (002) plane was 43 arcsec while a full-width at half-maximum of the twist of the AlN crystal (102) plane was 443 arcsec, the aluminum nitride substrate was immersed in a flux having a molar ratio of gallium to aluminum of 40:60 under atmospheric pressure for 5 hours. As a result, the full-width at half-maximum of the tilt of the AlN crystal (002) plane was 374 arcsec while the full-width at half-maximum of the twist of the AlN crystal (102) plane was 896 arcsec. Also, the film thickness of the AlN crystals was 1.2 µm. Also, the epitaxially grown AlN film was evaluated to have aluminum polarity.

Example 6

Next, the temperature of a flux having a molar ratio of gallium to aluminum of 98:2 was made to be raised in argon gas. After the temperature reaches the melting point of Al, 0.1 MPa of nitrogen gas was introduced into a furnace at a flow rate of 20 cc/min. Then, a temperature of the flux in a crucible was maintained at 1200 degrees C., and an aluminum nitride substrate in which a full-width at half-maximum of the tilt of the AlN crystal (002) plane was 57 arcsec while a full-width at half-maximum of the twist of the AlN crystal (102) plane was 392 arcsec was immersed in the flux under atmospheric pressure. After 6 hours passed, the aluminum nitride substrate was taken out from the flux and cooled slowly, whereby aluminum nitride crystals were produced. As a result, the full-width at half-maximum of the tilt of the AlN crystal (002) plane was 238 arcsec while the full-width at half-maximum of the twist of the AlN crystal (102) plane was 417 arcsec. Also, the film thickness of the AlN crystals was 1.2 µm. Also, the epitaxially grown AlN film was evaluated to have aluminum polarity.

TABLE 2

| | | Example 1 | Example 2 | Example 3 | Example 4 | Example 5 | Example 6 |
|---|---|---|---|---|---|---|---|
| Experimental Conditions | Molar Ratio (Ga:Al) | 70:30 | 70:30 | 60:40 | 50:50 | 40:60 | 98:2 |
| | $N_2$ Bubbling (cc/min) | 20 | 20 | 20 | 20 | 20 | None |
| | Growth Temperature (degrees C.) | 1300 | 1300 | 1300 | 1300 | 1300 | 1200 |
| | Growth Time (h) | 29 | 5 | 5 | 5 | 5 | 6 + flux slow-cooling |
| Before LPE | 002 plane TILT (arcsec) | 83 | 36 | 36 | 54 | 43 | 58 |
| | 102 plane TILT (arcsec) | 407 | 461 | 461 | 439 | 443 | 392 |
| After LPE | 002 plane TILT (arcsec) | 288 | 79 | 50 | 68 | 374 | 238 |
| | 102 plane TILT (arcsec) | 670* | 576* | 544* | 698* | 896* | 417 |
| | Growth Film Thickness (µm) | 2.0 | 0.7 | 1.0 | 0.3 | 1.2 | 1.2 |

*A rotational domain which is approximately 1 degree away from a c-axis is present.

Table 2 shows experimental conditions and evaluations of the AlN crystal films in Examples 1 to 6. From these results, it was found that the use of a melt of a Ga—Al alloy having a molar ratio of Ga to Al of from 98:2 to 40:60 as a flux enabled the crystal growth of AlN at a low temperature and enabled the achievement of good AlN crystals which inherited the crystallinity of a substrate surface and had aluminum polarity on the substrate having nitrogen polarity. Particularly, the use of a flux having a molar ratio of Ga to Al of from 98:2 to 50:50 enabled achievement of excellent AlN crystals in which a full-width at half-maximum of the tilt of the AlN crystal (002) plane was not more than 300 arcsec. It was also found that, by introducing (bubbling) nitrogen gas into the flux, excellent AlN crystals were able to be obtained even under atmospheric pressure.

Example 7

Next, to evaluate the epitaxially-grown AlN films, dislocation analysis and polarity determination were performed. For a sample for observation of dislocations and polarity determination, a melt of a Ga—Al alloy having a molar ratio of Ga to Al of 60:40 was used as a flux, and an AlN film obtained by growing AlN crystals on a nitrided sapphire substrate at 1300 degrees C. for 5 hours was used. The crystallinity of the AlN film was evaluated by X-ray rocking curve measurement, and, as a result, the full-width at half-maximum of the X-ray rocking curve was 50 arcsec in 0002 diffraction and 590 arcsec in 10-12 diffraction.

Burger's vectors of spiral and edge dislocations of AlN are represented as $b_s=[0001]$ and $b_e=\frac{1}{3}[11-20]$, respectively. In the case where a reciprocal lattice vector of a diffraction plane is g, when $g \cdot b_s=0$ and $g \cdot b_e=0$, images in which the contrasts of spiral and edge dislocations do not appear, respectively, are obtained. In the present embodiment, an incidence angle of an electron beam is slightly tilted from the [11-20] direction of the sample so as to excite a g=[0002] diffraction line, whereby a bright field image was obtained under a two-beam condition. With the same manner, bright field images of diffraction lines of g=[10-10] and g=[10-12] were obtained under a two-beam condition, and, by comparing these images, a dislocation type was determined.

In polar determination of the AlN film by a CBED method, an electron beam was incident from the [11-20] direction of the sample. Polarity was determined by comparing with a pattern obtained by a simulation.

FIG. 7A, FIG. 7B, and FIG. 7C show bright field images under a two-beam condition using diffraction lines of g=[0002], g=[10-10], and g=[10-12], respectively. A threading dislocation line, which is observed in FIG. 7B and FIG. 7C, is not observed at all in the image of FIG. 7A. From this comparison, it was found that all the dislocations which were observed within visual fields of FIG. 7A to FIG. 7C were edge dislocations, and screw dislocations were extremely less than edge dislocations. This was consistent with the result expected from a full-width at half-maximum of the XRC.

Figure 8A:
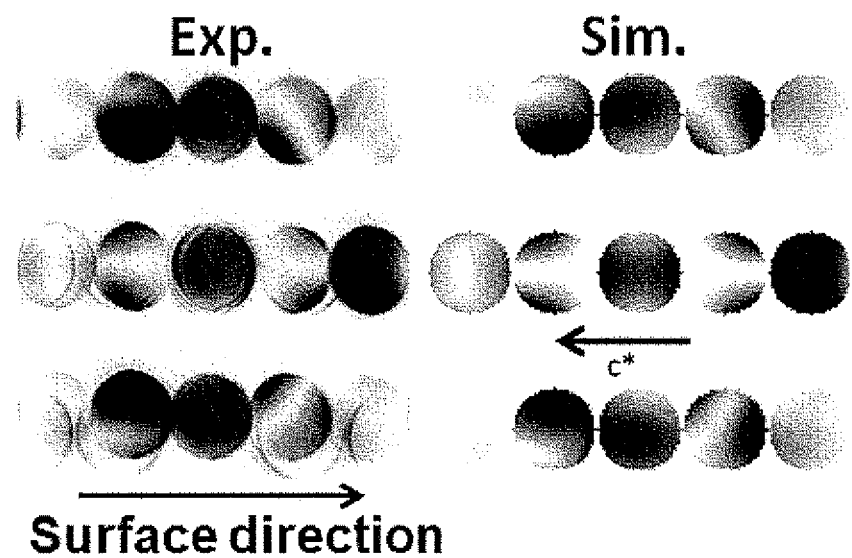
FIG. 8A is a schematic diagram showing a CBED pattern of an AlN layer obtained by sapphire nitriding and a simulation pattern in combination.
Figure 8B:
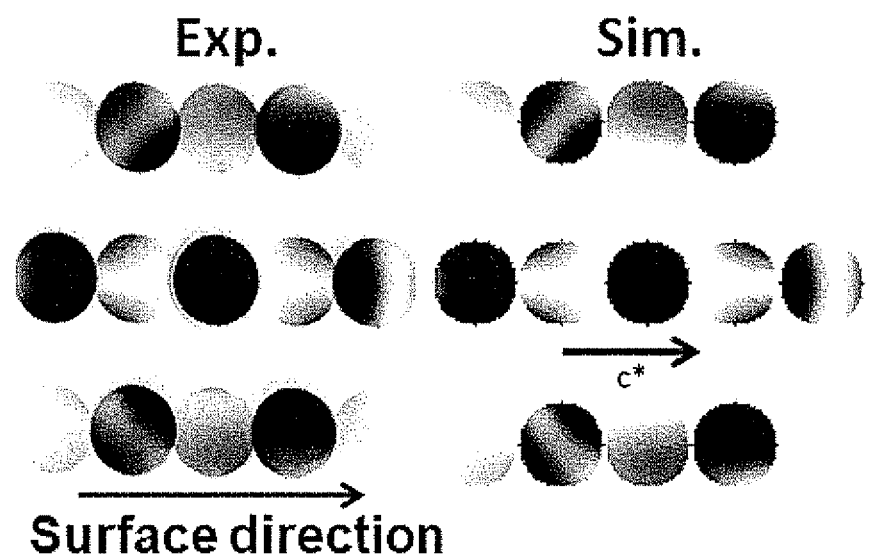
FIG. 8B is a schematic diagram showing a CBED pattern of an AlN layer grown by LPE (liquid phase epitaxy) and a simulation pattern in combination.

Each of FIG. 8A and FIG. 8B shows a CBED figure and a simulation pattern obtained by the experiment, in combination. FIG. 8A shows an AlN layer obtained by sapphire nitriding, while FIG. 8B shows an AlN layer grown by LPE (liquid phase epitaxy). As a result, it was found that the sapphire nitride layer had nitrogen polarity while the LPE layer had Al polarity resulting from the reversal of polarity.

Example 8

Aluminum nitride crystals were produced in the same manner as in Example 3, except that, before being immersed in a flux having a molar ratio of gallium to aluminum of 60:40, an aluminum nitride substrate was held at a position 3 cm just above the melt of the Ga—Al alloy. A temperature of the aluminum nitride substrate which was held just above the melt of the Ga—Al alloy was 1300 degrees C.

As a result, the full-width at half-maximum of the tilt of the (002) plane of the AlN crystals grown on the aluminum nitride substrate was 208 arcsec while the full-width at half-maximum of the twist of the (102) plane thereof was 668 arcsec. Also, the film thickness of the AlN crystals was 1.0 µm. Also, the epitaxially grown AlN film was evaluated to have aluminum polarity, and a rotational domain, such as the one shown in Example 3, which was approximately 1 degree away from a c-axis was not present. It is thought that, by annealing effects, the AlN thin film of the aluminum nitride substrate was made to be a single domain.

REFERENCE SIGNS LIST

1 . . . gas introducing pipe, 2 . . . crucible, 3 . . . seed substrate, 4 . . . melt of a Ga—Al alloy, 5 . . . heater, 6 . . . gas exhausting pipe, 7 . . . thermocouple

The invention claimed is:

1. A method for producing aluminum nitride crystals, the method comprising:
    introducing gas containing N atoms into a melt of a Ga—Al alloy; and
    epitaxially growing aluminum nitride crystals on a seed crystal substrate in said melt of the Ga—Al alloy.

2. The method for producing aluminum nitride crystals according to claim 1, wherein the above-mentioned seed crystal substrate is a nitrided sapphire substrate.

3. The method for producing aluminum nitride crystals according to claim 2, wherein the above-mentioned nitrided sapphire substrate is annealed at a temperature of not less than 900 degrees C. and not more than 1500 degrees C.

4. The method for producing aluminum nitride crystals according to claim 2, wherein aluminum nitride crystals having aluminum polarity are made to epitaxially grow on a aluminum nitride film having nitrogen polarity and being formed on the above-mentioned nitrided sapphire substrate.

5. The method for producing aluminum nitride crystals according to claim 1, wherein, with introducing $N_2$ gas into the above-mentioned melt of the Ga—Al alloy, aluminum nitride crystals are made to epitaxially grow.

6. The method for producing aluminum nitride crystals according to claim 1, wherein, a temperature of the above-mentioned melt of the Ga—Al alloy is set at not less than 1000 degrees C. and not more than 1500 degrees C. to epitaxially grow aluminum nitride crystals.

7. The method for producing aluminum nitride crystals according to claim 1, wherein, a molar ratio of Ga to Al of the above-mentioned melt of the Ga—Al alloy is 98:2 to 40:60.

8. A crystal substrate, wherein aluminum nitride crystals having aluminum polarity are made to epitaxially grow on an aluminum nitride film having nitrogen polarity and being formed on a nitrided sapphire substrate.

* * * * *